United States Patent [19]

Choi et al.

[11] Patent Number: 5,046,049

[45] Date of Patent: Sep. 3, 1991

[54] METHOD OF FLASH WRITE FOR TESTING A RAM

[75] Inventors: Hoon Choi, Taegu; Seo Dong-Il, Seoul, both of Rep. of Korea

[73] Assignee: SamSung Electronics Co., Ltd., Suwon, Rep. of Korea

[21] Appl. No.: 496,517

[22] Filed: Mar. 20, 1990

[30] Foreign Application Priority Data

Nov. 18, 1989 [KR] Rep. of Korea .................... 89-16775

[51] Int. Cl.⁵ ............................................. G11C 13/00
[52] U.S. Cl. .................................... 365/201; 371/21.1
[58] Field of Search .................... 365/201, 51, 189.01, 365/230.01; 371/21

[56] References Cited

U.S. PATENT DOCUMENTS 4,661,930 4/1987 Tran ..................................... 365/201
4,703,453 10/1987 Shinoda ............................. 365/201

Primary Examiner—Terrell W. Fears
Attorney, Agent, or Firm—Ladas & Parry

[57] ABSTRACT

In a memory device(DRAM), an improved flash write test method is disclosed whereby all the memory cells in a memory cell array of a memory device can be written with the internally same data or the externally same data. The bit lines are arranged such that the bit lines B/L and $\overline{B/L}$ are alternating throughout the memory cell array and such that one word line is connected to only one type(either B/L or $\overline{B/L}$) of bit lines, and the data supply circuit is formed by a data controller which controls input/output drives according to the type of the bit lines connected to the selected word line.

2 Claims, 2 Drawing Sheets

METHOD OF FLASH WRITE FOR TESTING A RAM

BACKGROUND OF THE INVENTION

The present invention relates to a memory device(-DRAM), and more particularly to a method of flash write (high speed write) which enables high-speed writing operation when a high density memory device should be tested.

As the level of integration of a memory device becomes higher, more elaborate processes are required for forming various layers and patterns. The faulty ratio of cells in the memory device is determined by the presence of foreign particles such as dusts or other contaminants in the fabricating environment. Especially, because the faulty ratio of cells increases along with the level of integration, the test circuit have come to be incorporated within the memory circuit these days.

Even if the RAM test is performed internally in the memory device itself, there remains a problem that the time required for testing increases with the high density of integration. That is, in the prior art for the high speed RAM test, the test is performed by using bit by a bit unit ($\times 4$, $\times 8$, $\times 16$) in response to a test signal. In the prior art, xbits are written through the I/O line by the test signal, xbits are read out through the I/O line and the results are checked for errors. Therefore, the time required for the test is equal to the level of integration divided by xbits, indicating a longer test time for a higher density of integration.

Also, in the flash write method which aims to reduce the test time, a large amount of data can be written simultaneously into the memory cells because when a word line is selected, the bit lines of all the memory cells connected to this word line is connected to the I/O line in a simultaneous manner.

However, even with the flash write method, it is not possible to write the same data (1 or 0) into internally all the memory cells connected to one word line which is selected according to the position of the memory cell, even though only one test data (1 or 0) is input, since the arrangements of the bit lines B/L and $\overline{B/L}$ within a pair of bit lines connected to a sense amplifier not uniform throughout a memory device due to the DRAM's structure. The bit lines B/L and $\overline{B/L}$ are arranged in the order of B/L-$\overline{B/L}$ in some region in the memory device and in the order of B/L-B/L in another region in the memory device, although these two different arrangements are repeated in a regular pattern in the memory device. Thus, one word line is connected to a number of bit lines B/L and also to a number of bit lines $\overline{B/L}$ at the same time.

SUMMARY OF THE INVENTION

It is an object of the present invention to provide an improved flash write method for testing a RAM whereby the same data can be written to internally all the memory cells connected to a selected word line during the high-speed RAM test. By using the test method according to the present invention, it is possible to write the same data into internally the memory cells and externally the memory cells when a test data is supplied to test RAM's.

To achieve the above-mentioned object, the present invention is characterized by an improved flash write method to test a RAM wherein the relative positions of the bit lines B/L and $\overline{B/L}$ in a pair of bit lines are uniform (B/L-$\overline{B/L}$) throughout a memory cell array comprising first memory areas and second memory areas, in a memory device (RAM) comprising a transfer means for transferring now address signals to a memory cell array, said transfer means including a row address buffer and a row decoder, a data supply means for supplying data to be written into the memory cells of the memory cell array, said data supply means having an input/output driver and a data supply circuit, a memory cell array having a plurality of first memory areas and a plurality of second memory areas, said plurality memory areas each comprising its sense amplifiers and memory cells, and a plurality of gate means for connecting said first memory areas and said second memory areas with said data supply means, said gate means being connected between the input/output lines and the bit lines.

BRIEF DESCRIPTION OF THE DRAWINGS

These and other objects, features, and advantages of the present invention will become more apparent from the following description for the preferred embodiments taken in conjunction with the accompanying drawings in which.

DETAILED DESCRIPTION OF THE PREFERRED EMBODIMENT

The present invention will now be described in detail according to the accompanying drawings.

Figure 1:
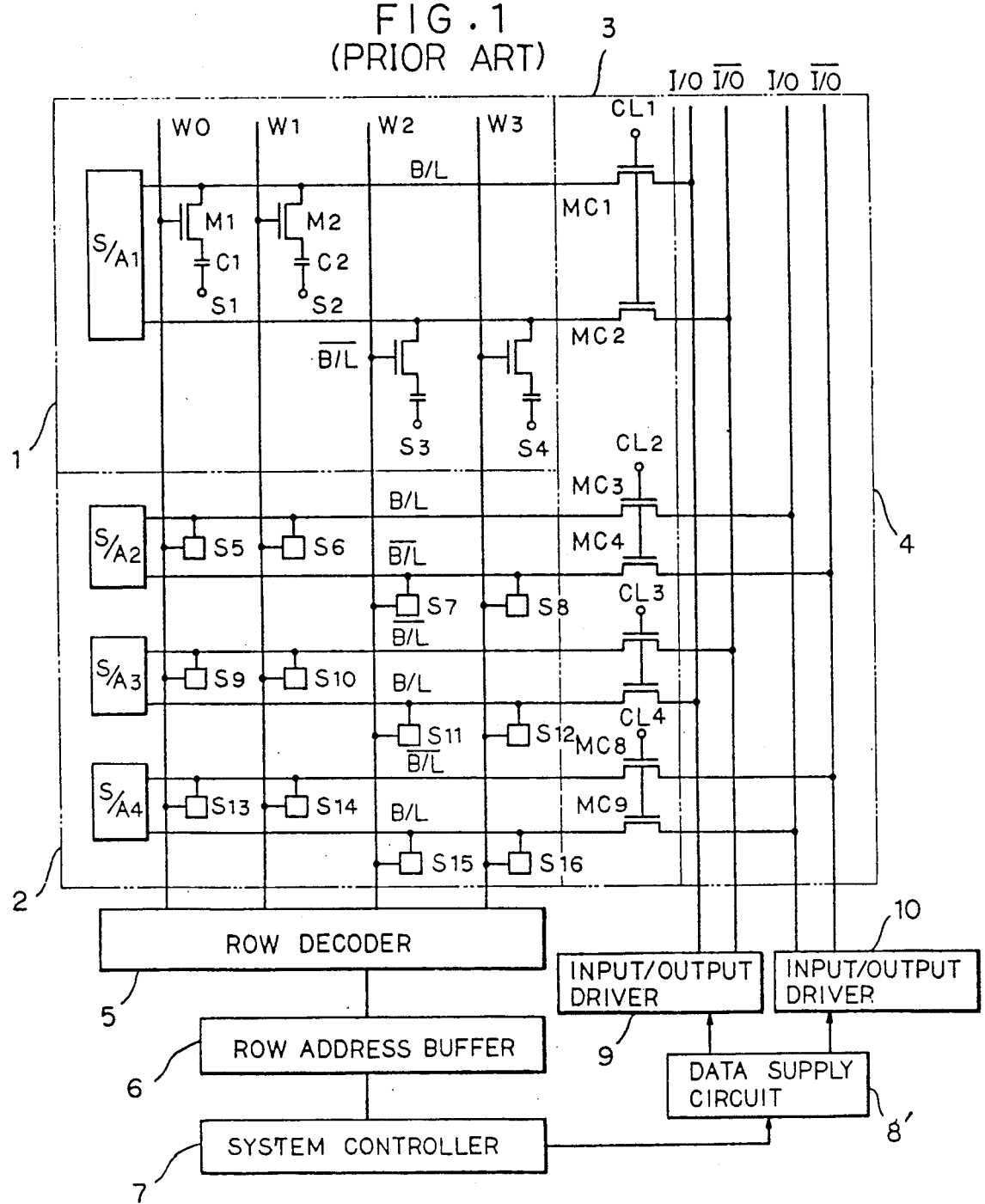
FIG. 1 is a circuit diagram showing a conventional flash write circuit to test RAM.

FIG. 1 is a circuit diagram for a conventional flash write circuit to test a RAM. The transfer means for transferring row address signals includes a row address buffer 6 and a row decoder 5, and the data supply means for supplying data to be written into the memory cells includes a data supply circuit 8 and two input/output drivers 9, 10. In the memory cell array, a plurality of memory areas such as the first memory area 1 and a second memory area 2 are formed, each of said plurality of memory areas including gate means for connecting the said memory areas with the input/output lines I/O and $\overline{I/O}$, said gate means comprising MOS transistors MC1, MC2 . . . as shown in FIG. 1.

The said MOS transistors MC1, MC2 . . . are controlled by column select signals CL1, CL2 . . . , and connected to the input/output drivers 9, 10 of the said data supply means through the input/output bus 4. As shown in FIG. 1, in the first memory area 1 and the second memory area 2 of the memory cell array, the bit lines B/L and $\overline{B/L}$ are arranged in the order of B/L-$\overline{B/L}$ somewhere and in the order of $\overline{B/L}$-B/L elsewhere. In the configuration shown in FIG. 1, when a row address signal from the system controller 7 is applied to the row decoder 5 through the address buffer 6, the row address signal is applied to the selected word line(W0, W1, . . . ) to select corresponding memory cells. And in response to the signal from the system controller 7, dating will write date to memory cells, the data supply circuit will supply the data (1 or 0) through the input/output drivers 9 and 10 on the input/output lines I/O and $\overline{I/O}$. The input/output lines I/O and $\overline{I/O}$ always carry two opposite types of data. Then, the bit lines B/L and $\overline{B/L}$ are connected with the input/output lines I/O and $\overline{I/O}$ in response to the column select signals CL1, CL2 . . . , whereby the test data is written into the memory cells.

At this time, the bit line B/L is connected with the input/output line I/O and the bit line $\overline{B/L}$ is connected with the input/output line I/O, so as to write the data carried by the input/output lines into the memory cells connected to the selected word line. However, as shown in the first memory area 1 and the second memory area 2, one word line, W0 for example, is connected to two types of bit lines (B/L and $\overline{B/L}$) through different memory cells. This means that when a word line is selected, data "1" will be written into the memory cells connected to the word line and the bit line B/L, while data "0" will be written into the memory cells connected to the same word line but connected to the bit line $\overline{B/L}$.

For example, when the word line W0 is selected, the memory cells S1 and S5 will be written with data "1" as supplied from the input/output line I/O, but the memory cells S9 and S13 will be written with data "0" as supplied from the input/output line $\overline{I/O}$, because the latter cells are connected to the bit line $\overline{B/L}$. Accordingly, during the flash write test, some memory cells will store "1" while the other memory cells will store "0", even though just one type of data was originally supplied from the data supply circuit. Thus, the data written in this manner is the same only in an "external" point of view.

Of course, data is written into all the memory cells connected to one word line, by connecting all the bit lines with their corresponding input/output lines by driving all the column select signals CL1, CL2 of H Level signal . . . to a high level during the flash write operation.

Figure 2:
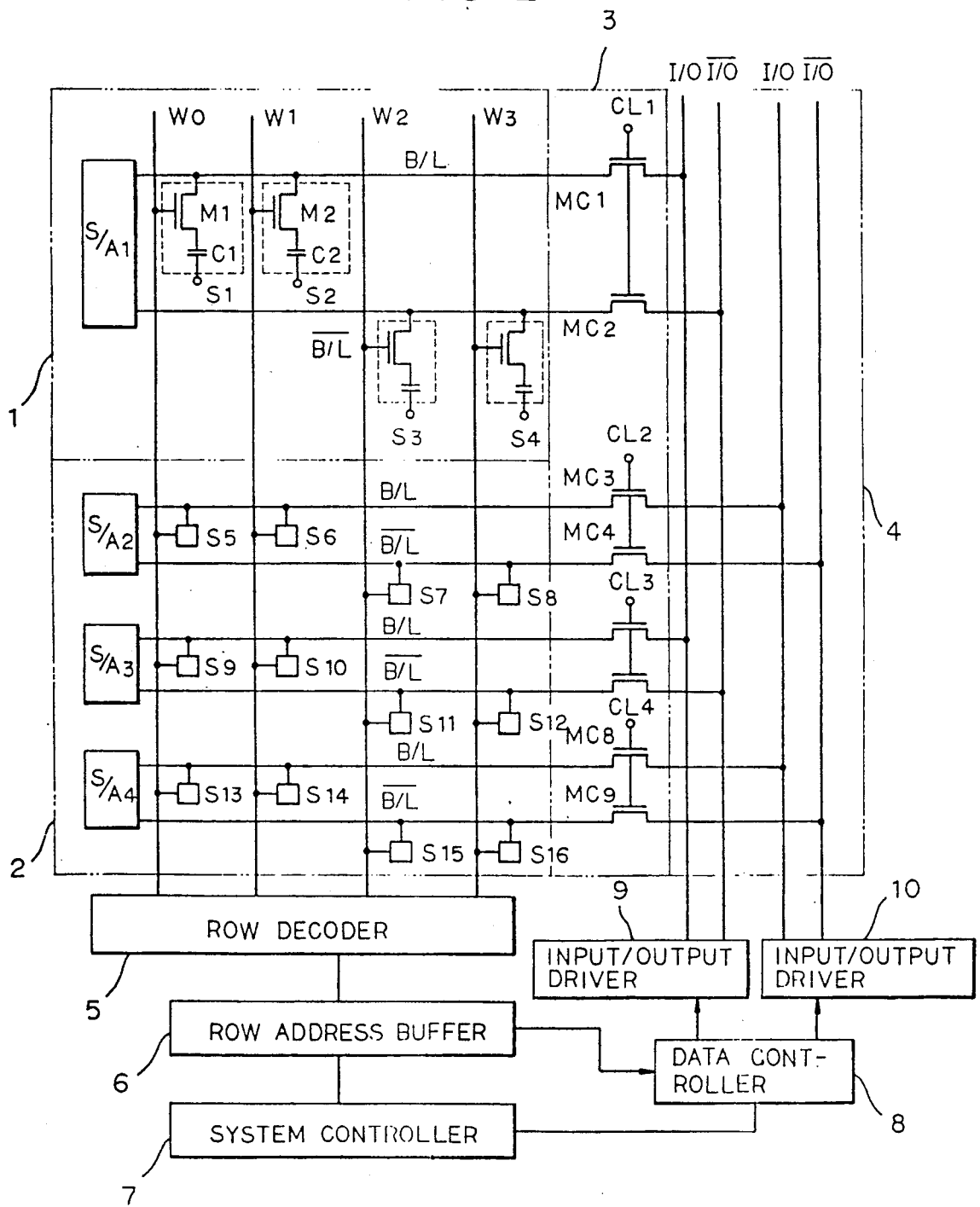
FIG. 2 is a circuit diagram showing the flash write circuit to test a RAM according to the present invention.

FIG. 2 is a circuit diagram for the flash write test according to the present invention. The first memory area 1 and the second memory area 2 have the structure of a standard DRAM, and show the structure as on a design layout. In other words, the first memory area 1 has the same structure as the second memory area 2, both having a plurality of memory cells.

In the first memory area 1, a memory cell S1 comprising a MOS transistor M1 and a capacitance C1 is connected to the bit line B/L and the work line W0, and another memory cell S2 is connected to the bit line B/L and the next word line W1. The memory cell S3 is connected to the bit line $\overline{B/L}$ and the work line W2, and the memory cell S4 is connected to the bit line $\overline{B/L}$ and the work line W3.

A sense amplifier (S/A1) is provided between the two bit lines B/L and $\overline{B/L}$ for sensing and amplifying the voltage difference between the two lines, and MOS transistors MC1 and MC2 are provided on the bit lines B/L and $\overline{B/L}$ respectively for connecting each of the two bit lines with the input/output lines I/O and $\overline{I/O}$ respectively of the I/O bus 4.

Although FIG. 2 shows only the first memory area and the second memory area, there may be provided a plurality of memory areas according to the required memory capacity. Especially, the paired bit lines B/L and B/L are arranged in the uniform order of B/L-B/L-B/L-BL . . . in the first memory area 1 and the second memory area 2. And the system controller 7 for controlling data input/output from or to the memory cells in the memory areas are connected to the now address buffer 6 and the data controller 8 for controlling the data to be written, and the said row address buffer 6 is further connected through the row decoder 5 to the word lines W0, W1, W2 . . . in the first and second memory areas 1 and 2. Further, the data controller 8 is connected to the input/output bus 4 through the input/output drivers 9 and 10 so that data may be supplied on the input/output lines I/O and $\overline{I/O}$.

Accordingly, the transfer means for transferring row address signals includes a row address buffer 6 and a row decoder 5, and the data supply means for supplying the data to be written into memory cells includes a data controller 8 and input/output drivers 9 and 10. The memory cell array comprises a plurality of first memory areas 1 and a plurality of second memory areas 2. Each memory area includes the gate means for connecting the said memory area to input/output lines I/O and $\overline{I/O}$. The gate means is composed of the MOS transistors MC1, MC2, . . . , as shown in FIG. 2, which are controlled by the column select signals CL1, CL2 . . . . These MOS transistors MC1, MC2 . . . are connected to the input/output drivers 9 and 10 of the data supply means through the input/output bus 4. Especially, the relative positions of the two bit lines B/L and $\overline{B/L}$ are no more non-uniform. Instead, the relative positions of the two bit lines B/L and $\overline{B/L}$ in a pair are uniform throughout the memory cell array, i.e. the bit lines B/L and $\overline{B/L}$ are alternating in a constant pattern throughout the memory cell array. This means that only one type of the bit lines, either B/L or $\overline{B/L}$, is connected to one word line.

First, the principle of write and read operations is the same as that of the standard DRAM's. The write and read operations will be explained herein after using the first memory area as an example. When the MOS transistors MC1 and MC2 are turned ON in response to the column select signal CL1, the set of input/output lines I/O and $\overline{I/O}$ on the left are selected and thereby the said input/output lines I/O and $\overline{I/O}$ are connected to the sense amplifier S/A1 through the bit lines B/L and $\overline{B/L}$. If it is desired to write data into the memory cell S1, the MOS transistor MC1 is turned ON by the column select signal CL1, so that the state signal on the input/output line I/O is applied to the bit line B/L.

The MOS transistor M1 is turned on by a high level signal on the selected word line W0, and the capacitor C1 is charged by the state signal on the bit line B/L. When it is desired to read data from the memory cell S1, first the MOS transistor M1 is turned on by driving the word line W0 high. The charge stored in the capacitor C1 is discharged to the bit line B/L, and the state signal of the bit line B/L is sensed and amplified by the sense amplifier. The amplified signal is output to the input/output line I/O through the MOS transistor MC1 selected by a column select signal. Although only the memory cell S1 connected to the sense amplifier S/A1 was mentioned as an example, the above mentioned write and read operations are the same for all the other memory cells S2, S3 . . . .

Further, the process of writing data into RAM during the flash write operation will be described herein after. In the write operation, the system controller 7 supplies the row address signal for the desired memory cells through the row address buffer 6, and the signal is selected by the row decoder 5 to select the word line corresponding to the memory cells to be tested. If the word line W0 is selected according to a row address signal, all the column select signals CL1, CL2, CL3 . . . become high levels and are applied to the gates of the MOS transistors to connect the bit lines B/L and $\overline{B/L}$ with the input/output lines I/O and $\overline{I/O}$ of the input/output bus, so that data may be written into all the memory cells S1, S5, S9 . . . connected to the word line W0. If data "1" is to be written, the data controller 8 controls the input/output drivers 9 and 10 so that data "1" may be carried on the input/output line I/O, whereby the memory cell S1, S5, S9 . . . as selected by the word line W0 are written with data "1". If the word line W2 in the first memory area 1 and the second memory area 2 is selected according to another row address signal, the memory cells S7, S11, S15 . . . connected to the word line W2 are written with data "1" through the bit line $\overline{B/L}$. In this case, the input/output line I/O carries the data "0". The data controller 8 receives the row address signal output from the row address buffer 6. If the word lines W2, W3, W6, W7 . . . to which only the bit lines $\overline{B/L}$ are connected through the memory cells are selected, the data controller 8 recognizes that the bit lines B/L are connected this time, and so controls the input/output drivers 9 and 10 that data "1" is applied on the input/output line $\overline{I/O}$. Accordingly, it is possible to write "internally" the same data ("1" or "0") into the memory cells.

When the data "1" or "0", which is externally the same, is to be written, the operation is the same as above-mentioned, except that the routine controlling the data controller 8 is removed when the word lines W2, W3, W6, W7 . . . are selected at the row address buffer. Accordingly, the input/output lines $\overline{I/O}$ and I/O carry two opposite types of data as being output from the data controller through the input/output drivers 9 and 10, and when the memory cells selected by the word lines W0 and W1 are written with data "1", the memory cells selected by the word lines W2 and W3 are written with data "0", so that the write data is the same only from the external point of view.

As described, according to the present invention, the same data a can be written into all the memory cells connected to a selected word line, because the bit lines of the memory cells connected to the word line consist of only the bit lines B/L or only the bit lines B/L, without the two different types of bit lines being connected to one same word line.

Further, a data controller is provided for forming the data pattern of the memory cell, which is controlled by the row address signal so that the data to be stored may be carried onto the input/output line. Accordingly, it is possible to write only one type of data (0 or 1) to all the memory cells in the memory cell array, either externally, i.e. so that only one type of data may be read out from all the memory cells, or internally, so that all the memory cells may be charged or all the memory cells may be not charged, during flash-write operation.

As mentioned above, it is possible to reduce the time required for test by writing one type of data (1 or 0) to all the memory cells, either externally or internally. Therefore, if this invention is applied to a Video RAM, all the memory cells can be processed in the shortest time.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications of embodiments as fall within the true scope of the invention.

What is claimed is:

1. A flash write method for testing RAM's in a RAM device including a transfer means for transferring row address signals to a memory cell array, said transfer means including a row address buffer and a row decoder, a data supply means for supplying data to be written into each cell of the memory cell array, said data supply means having input/output drivers and a data supply block, a memory cell array having memory areas such as first memory area and second memory area, said memory areas each comprising sense amplifiers and memory cells, and a gate means for connecting the first and second memory areas of the memory cell array with the data supply means, said gate means being inserted between the bit lines (B/L and $\overline{B/L}$) and the input lines (I/O and $\overline{I/O}$), which comprises arranging the pair of bit lines (B/L and $\overline{B/L}$) in an alternating manner wherein the relative positions of the pair of bit lines (B/L and $\overline{B/L}$) in the first and second memory areas are the same throughout the memory cell array.

2. A flash write method for testing RAM's according to claim 1, wherein the data supply means forming the data supply block comprises a data controller controlled by a row address buffer, and one of the plurality of row address signals from the row address buffer is supplied to the input/output drivers and as a control signal wherein data pattern is supplied to a memory cell.

* * * * *

UNITED STATES PATENT AND TRADEMARK OFFICE
CERTIFICATE OF CORRECTION

PATENT NO. : 5,046,049
DATED : SEPTEMBER 3, 1991
INVENTOR(S) : Hoon CHOI ET AL It is certified that error appears in the above-identified patent and that said Letters Patent is hereby corrected as shown below:

Title page, Item [75] Inventors: change "Seo Dong-Il" to -- Dong-IL Seo--.

Signed and Sealed this

Twentieth Day of April, 1993

Attest:

MICHAEL K. KIRK

Attesting Officer

Acting Commissioner of Patents and Trademarks